United States Patent
Shatalov et al.

(10) Patent No.: US 9,502,509 B2
(45) Date of Patent: Nov. 22, 2016

(54) STRESS RELIEVING SEMICONDUCTOR LAYER

(71) Applicant: Sensor Electronic Technology, Inc., Columbia, SC (US)

(72) Inventors: Maxim S. Shatalov, Columbia, SC (US); Jinwei Yang, Columbia, SC (US); Wenhong Sun, Columbia, SC (US); Rakesh Jain, Columbia, SC (US);
(Continued)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

(21) Appl. No.: 15/083,423

(22) Filed: Mar. 29, 2016

(65) Prior Publication Data
US 2016/0211331 A1   Jul. 21, 2016

Related U.S. Application Data

(63) Continuation of application No. 14/266,900, filed on May 1, 2014, now Pat. No. 9,330,906.
(Continued)

(51) Int. Cl.
| | |
|---|---|
| *H01L 31/00* | (2006.01) |
| *H01L 29/15* | (2006.01) |
| *H01L 29/205* | (2006.01) |
| *H01L 29/20* | (2006.01) |
| *H01L 29/06* | (2006.01) |

(52) U.S. Cl.
CPC ......... *H01L 29/158* (2013.01); *H01L 29/0657* (2013.01); *H01L 29/2003* (2013.01); *H01L 29/205* (2013.01)

(58) Field of Classification Search
CPC .......... H01L 21/02458; H01L 21/0254; H01L 21/0265; H01L 21/02639; H01L 21/0237; H01L 33/007; H01L 33/12; H01L 29/2003
See application file for complete search history.

(56) References Cited

U.S. PATENT DOCUMENTS

| | | | |
|---|---|---|---|
| 6,844,569 B1 * | 1/2005 | Lee | ............. C30B 29/605 257/103 |
| 7,776,636 B2 | 8/2010 | Wang | |
| 2003/0203531 A1 * | 10/2003 | Shchukin | ............. B82Y 10/00 438/77 |

(Continued)

FOREIGN PATENT DOCUMENTS

| | | |
|---|---|---|
| JP | 2004-055864 A | 2/2004 |
| JP | 2006-100501 A | 4/2006 |
| KR | 20120095080 A | 8/2012 |

OTHER PUBLICATIONS

Altahtamouni et al., "Effects of double layer AlN buffer layers on properties of Si-doped AlxGa12xN for improved performance of deep ultraviolet light emitting diodes," Journal of Applied Physics 113, 2013, pp. 123501.
(Continued)

*Primary Examiner* — Victor A Mandala
(74) *Attorney, Agent, or Firm* — LaBatt, LLC

(57) ABSTRACT

A semiconductor structure, such as a group III nitride-based semiconductor structure is provided. The semiconductor structure includes a cavity containing semiconductor layer. The cavity containing semiconductor layer can have a thickness greater than two monolayers and a multiple cavities. The cavities can have a characteristic size of at least one nanometer and a characteristic separation of at least five nanometers.

20 Claims, 7 Drawing Sheets

(72) Inventors: Michael Shur, Latham, NY (US);
Remigijus Gaska, Columbia, SC (US)

Related U.S. Application Data

(60) Provisional application No. 61/817,970, filed on May 1, 2013.

(56) References Cited

U.S. PATENT DOCUMENTS

| | | | | |
|---|---|---|---|---|
| 2005/0217565 | A1* | 10/2005 | Lahreche | H01L 21/76248 117/84 |
| 2007/0072320 | A1* | 3/2007 | Frayssinet | C30B 25/02 438/22 |
| 2009/0001416 | A1 | 1/2009 | Chua et al. | |
| 2009/0278233 | A1* | 11/2009 | Pinnington | H01L 21/02389 257/615 |
| 2010/0133656 | A1* | 6/2010 | Hager, IV | H01L 21/324 257/615 |
| 2011/0092051 | A1 | 4/2011 | Moriceau et al. | |

OTHER PUBLICATIONS

Hultman, "Self-Organized Nanostructuring in Hard Nitride Thin Films," Sep. 9-13, 2013 available at http://www.ivc19.com/fileadmin/document/Abstracts/Hultman_Abstract.pdf at least as early as Apr. 30, 2013.

Kuramochi et al., "Perfect spatial ordering of self-organized InGaAs/AlGaAs box-like structure array on GaAs (311)B substrate with silicon nitride dot array", Applied Physics Letter 71, 1997, pp. 1655.

Park, H., International Application No. PCT/US2014/036291, International Search Report and Written Opinion, Dec. 18, 2015, 12 pages.

MANDALA, V. U.S. Appl. No. 14/266,900, Notice of Allowance, Jan. 11, 2016, 13 pages.

MANDALA, V. U.S. Appl. No. 14/266,900, Non-Final Rejection1, Sep. 10, 2015, 22 pages.

\* cited by examiner

STRESS RELIEVING SEMICONDUCTOR LAYER

REFERENCE TO RELATED APPLICATIONS

The current application is a continuation application of U.S. application Ser. No. 14/266,900, which was filed on 1 May 2014 now U.S. Pat. No. 9,330,906, and which claims the benefit of U.S. Provisional Application No. 61/817,970, titled "Stress Relieving Semiconductor Layer," which was filed on 1 May 2013, both of which are hereby incorporated by reference.

TECHNICAL FIELD

The disclosure relates generally to growth of semiconductor layers, and more particularly, to an improved solution for growing semiconductor layers.

BACKGROUND ART

Group III nitride semiconductors are widely used for efficient blue and ultraviolet light emitting diodes, lasers, ultraviolet detectors, and field effect transistors. Due to a wide band-gap, these materials are one of the primary choices for fabricating deep ultraviolet light emitting diodes (DUV LEDs). In recent years, significant advances have been made in improving the efficiency of DUV LED. However, overall efficiencies of these devices remain low. For fabrication of DUV LEDs, it is crucial to achieve a high quality AlN buffer layer as an underlying layer for the subsequent growth of any Al-rich group III nitride semiconductor layers. However, it is extremely difficult to grow an AlN layer with high crystal quality on sapphire, silicon carbide (SiC), and silicon, which are currently the main substrates for growth of group III nitride devices.

For light emitting devices, such as light emitting diodes (LEDs) and especially deep ultraviolet LEDs (DUV LEDs), minimizing a dislocation density and a number of cracks in the semiconductor layers increases the efficiency of the device. To this extent, several approaches have sought to grow low-defect semiconductor layers on patterned substrates. These approaches typically rely on reducing stresses present in epitaxially grown semiconductor layers.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Other approaches rely on epitaxially growing a group III nitride based semiconductor superlattice. The superlattice structure mitigates the strain difference between an aluminum nitride (AlN)/sapphire template and the subsequent thick $Al_xGa_{1-x}N$ (where $0 \leq x \leq 1$) layers. For devices such as DUV LEDs, thick AlGaN epitaxial layers (e.g., of the order of a few micrometers) are desirable to reduce current crowding. Using a superlattice approach, an AlN/AlGaN superlattice was grown to reduce biaxial tensile strain and a 3.0-μm-thick $Al_{0.2}Ga_{0.8}N$ was achieved on sapphire without any cracks. Such a superlattice can be used to minimize the dislocation density due to varying stresses in the sublayers of the superlattice elements.

While the superlattice approaches allow some control of tensile and compressive stresses in epitaxially grown nitride semiconductor layers, the approaches do not enable epitaxial growth of nitride based semiconductor layers with uniform composition. Based on previous experience obtained from GaN growth, lateral epitaxial overgrowth (LEO) has been shown to be an efficient way for significant reduction of dislocation in GaN films. Several other technologies evolved from LEO, such as pendeo-epitaxial, cantilever epitaxy, and facet controlled LEO, have also been developed. While the above approaches work well for epitaxial growth of GaN semiconductor layers, epitaxial growth of AlN layers is more challenging due to small lateral growth of AlN films.

Another leading approach includes growth of AlN films over patterned substrates, such as, for example, patterned sapphire substrate (PSS). While the PSS based approaches generally produce an AlN layer with reduced stress and low dislocation densities, the patterning process and subsequent growth of AlN films is technologically complicated and costly.

One previously described approach proposes to reduce dislocation density between an AlGaN layer and a sapphire substrate by forming a self-organizing porous AlN layer of non-coalescing column-like islands with flat tops on the substrate. In this approach, the self-organizing porous AlN layer is grown at a relatively low V/III ratio of sixty. While the AlN layer is described as being porous, the disclosure does not define any details of such layer, nor does it disclose how the pores are connected or their sizes and densities.

SUMMARY OF THE INVENTION

The inventors propose a growth technology for a group III-V layer, in which the layer is grown at a significantly higher V/III ratio than that disclosed in the prior art. The inventors propose to control the size and density of cavities in the layer through a variable V/III ratio and/or a variable temperature schedule for growth of a nucleation layer, a cavity layer, and a subsequent semiconductor layer containing no cavities. Attributes of an embodiment of the cavity sizes and densities are described herein, and experimentally achieved results are presented in which the cavities are well separated from one another and are morphologically dissimilar to pores described in the prior art.

Aspects of the invention provide a semiconductor structure, such as a group III nitride-based semiconductor structure. The semiconductor structure includes a cavity containing semiconductor layer. The cavity containing semiconductor layer can have a thickness greater than two monolayers and a multiple cavities. The cavities can have a characteristic size of at least one nanometer and a characteristic separation of at least five nanometers.

A first aspect of the invention provides a structure comprising: a cavity containing layer, wherein the cavity containing layer is formed of a semiconductor material, has a thickness greater than two monolayers, and has a plurality of cavities, and wherein the plurality of cavities have a characteristic size of at least one nanometer and a characteristic separation of at least five nanometers.

A second aspect of the invention provides a device comprising: a cavity containing layer, wherein the cavity containing layer is formed of a semiconductor material, has a thickness greater than two monolayers, and has a plurality of cavities, and wherein the plurality of cavities have a characteristic size of at least one nanometer; and a semiconductor layer immediately adjacent to the cavity containing layer, wherein the semiconductor layer contains no cavities.

A third aspect of the invention provides a method comprising: fabricating a semiconductor structure, wherein the fabricating includes forming a cavity containing layer, wherein the cavity containing layer has a thickness greater than two monolayers and a plurality of cavities, and wherein the plurality of cavities have a characteristic size of at least one nanometer and a characteristic separation of at least five nanometers.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a semiconductor structure, such as a group III nitride-based semiconductor structure. The semiconductor structure includes a cavity containing semiconductor layer. The cavity containing semiconductor layer can have a thickness greater than two monolayers and a multiple cavities. The cavities can have a characteristic size of at least one nanometer and a characteristic separation of at least five nanometers. The inventors have found that embodiments of such a structure can be configured to reduce internal stresses, threading dislocations, and cracks in the semiconductor layers. Additionally, embodiments can be used to control and/or release built up internal stresses within the structure. As used herein, unless otherwise noted, the term "set" means one or more (i.e., at least one) and the phrase "any solution" means any now known or later developed solution.

Figure 1:
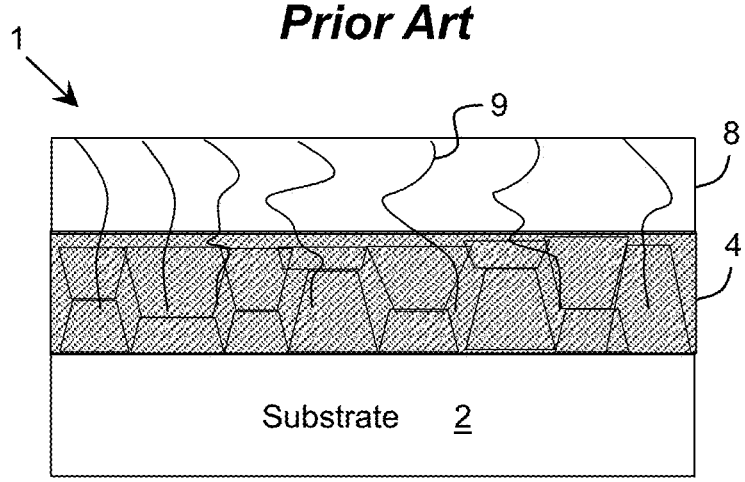
FIG. 1 illustrates a conventional approach for reducing dislocations according to the prior art.

FIG. 1 illustrates a conventional approach for reducing dislocations according to the prior art. In this approach, a structure 1 includes a substrate 2 on which a nucleation layer 4 is grown. A semiconductor (e.g., coalescing) layer 8 is grown on the nucleation layer 4. The nucleation layer 4 is configured to reduce a number of dislocations 9 present in the semiconductor layer 8 as compared to the number of dislocations 9 that would be present were the semiconductor layer 8 grown directly on the substrate 2.

Figure 2:
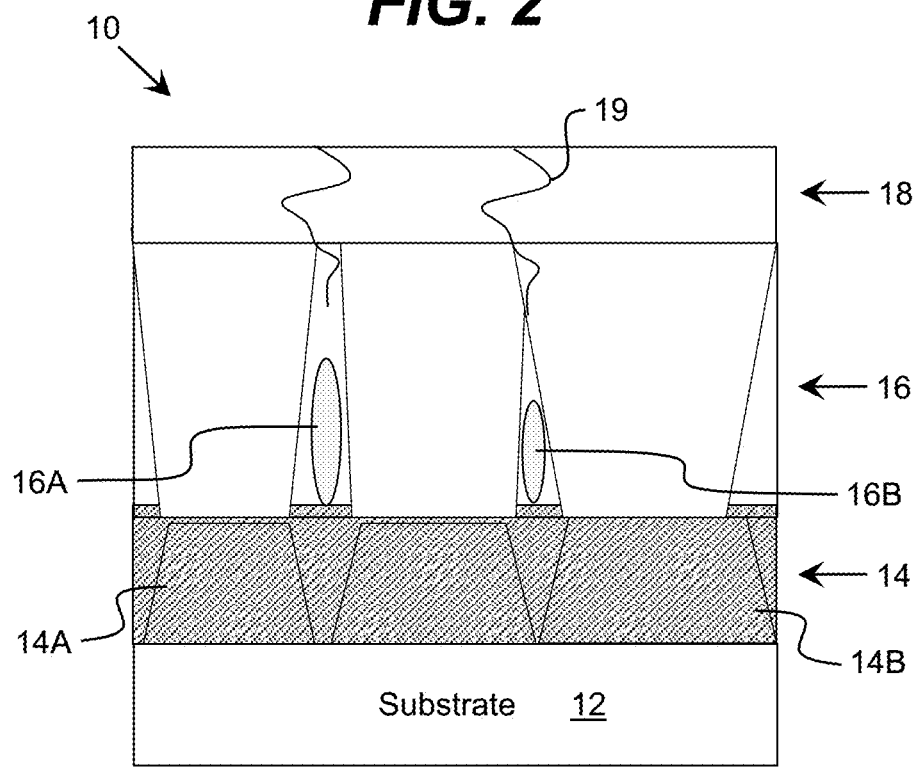
FIG. 2 shows an illustrative structure according to an embodiment.

FIG. 2 shows an illustrative structure 10 according to an embodiment. The structure 10 is shown including a substrate 12, a nucleation layer 14, a cavity containing layer 16, and a semiconductor (e.g., coalescing) layer 18. The cavity containing layer 16 can act as a stress-relieving layer in the structure 10. As illustrated, the semiconductor layer 18 can have significantly fewer dislocations 19 than present in the semiconductor layer 8 (FIG. 1) of the prior art.

In an embodiment, the semiconductor layers 14, 16, 18 of the structure 10 are formed of materials selected from the group III-V materials system. In a more particular embodiment, each layer 14, 16, 18 is formed of a group III nitride material. The substrate 12 can comprise any suitable substrate material. Illustrative substrate materials for group III nitride layers include sapphire, silicon carbide, silicon, lithium aluminate ($\gamma$-LiAlO$_2$), LiAlO$_2$, lithium gallate, spinel (MgAl$_2$O$_4$), gallium nitride (GaN), aluminum nitride (AlN), Aluminum oxynitride, zinc oxide (ZnO), and/or the like. Each layer 14, 16, 18 can have a thickness that is larger than two monolayers. In an embodiment, a thickness of each layer 14, 16, 18 is within a range of approximately ten to approximately ten thousand nanometers. A thickness of the cavity containing layer 16 can be selected based on a thickness by which the islands will coalesce, which is highly dependent on the original separation distance of nucleation islands in the nucleation layer 14. A thickness of the semiconductor layer 18 can be selected to limit cracking. For example, the thickness of the semiconductor layer 18 can be selected to reduce dislocation density by approximately an order of magnitude over that of the prior art. In a more specific illustrative embodiment: a thickness for the nucleation layer 14 is between approximately 5 nanometers and approximately 100 nanometers; a thickness of the cavity containing layer 16 is between approximately 1 micron and approximately 10 microns; and a thickness of the semiconductor layer 18 is between approximately 1 micron and approximately 4 microns.

In an embodiment, each of the layers 14, 16, 18 are epitaxially grown on the substrate 12. For example, the nucleation layer 14 can be epitaxially grown directly on the substrate 12. Growth of the nucleation layer 14 can include growth of a plurality of nucleation islands 14A, 14B at a growth temperature and V/III ratio configured to result in large nucleation islands 14A, 14B. For example, the growth temperature can be in a range of approximately 700° C. and approximately 1050° C., and the V/III ratio can be in a range between approximately 1000 and approximately 20000. During growth of the nucleation layer 14, a typical size of the nucleation islands 14A, 14B can be controlled by adjusting a V/III ratio used during the growth. In an embodiment, the nucleation islands 14A, 14B have a relatively large lateral size of a few to a few hundred nanometers (e.g., few tens of nanometers), with a similar separation distance between the islands 14A, 14B.

The cavity containing layer 16 can be epitaxially grown directly on the nucleation layer 14. In an embodiment, growth of the cavity containing layer 16 is configured to result in one or more cavities (voids) 16A, 16B being present in the cavity containing layer 16. For example, growth of the cavity containing layer 16 can be performed at a relatively high temperature, which can be approximately a few hundred degrees Celsius higher than a temperature used for growth of the nucleation layer 14. A characteristic size of the nucleation islands 14A, 14B can control a characteristic size and density of cavities 16A, 16B present in the cavity containing layer 16 due to a correlation between the size of the nucleation islands 14A, 14B and the spacing of cavities. For example, as cavities can form at some, but not necessarily all, boundaries of nucleation islands 14A, 14B, larger nucleation islands 14A, 14B will cause the cavities to be further apart. By growing the cavity containing layer 16 on a nucleation layer 14 with nucleation islands 14A, 14B having large lateral sizes, a density of cavities 16A, 16B present in the cavity containing layer 16 can be reduced, which can significantly reduce a number of threading dislocations 19 present in the semiconductor layer 18.

Furthermore, a temperature and/or V/III ratio used during growth of the cavity containing layer 16 can control a vertical size of the cavities 16A, 16B, e.g., by altering a lateral growth rate of the island formations in the cavity containing layer 16. The presence of the cavities 16A, 16B in the cavity containing layer 16 can reduce internal stresses, threading dislocations 19, and cracks in the semiconductor layers of the structure 10.

Subsequently, the semiconductor layer 18 can be epitaxially grown directly on the cavity containing layer 16 using any solution. To this extent, growth of the semiconductor layer 18 can be performed at any growth temperature and V/III ratio, configured to result in a coalesced semiconductor layer. In an embodiment, growth of the semiconductor layer 18 uses a lower V/III ratio and a higher growth temperature than those used in growing the cavity containing layer 16. In an embodiment, the semiconductor layer 18 has a different stoichiometry than the cavity containing layer 16. A structure 10 including the cavity containing layer 16 with the cavities 16A, 16B can reduce stresses associated with heteroepitaxy, which would otherwise be present in the semiconductor layer 18. As a result, the semiconductor layer 18 will have a reduced number of dislocations 19 and cracks.

As described herein, an embodiment of a semiconductor structure 10 can be fabricated by altering one or more growth conditions (e.g., temperature, pressure, composition, etc.) during formation of the various layers 14, 16, 18. Following is a description of an illustrative method for fabricating a semiconductor structure 10 including layers 14, 16, 18 formed of aluminum nitride (AlN)-based materials. While layers 14, 16, 18 are described as being distinct layers, when the layers 14, 16, 18 are formed of a uniform composition (AlN in the example below), the structure 10 can be considered as having a single layer formed using three distinct growth periods (each of which corresponds to the layers 14, 16, 18). Regardless, it is understood that the example below is only illustrative, and a similar method (but with different ranges for the growth conditions) can be applied to fabricate a semiconductor structure 10 including layers 14, 16, 18 formed of any combination of one or more types of compositions, such as any type of $Al_xIn_yB_zGa_{1-x-y-z}N$, where $0 \leq x, y, z \leq 1$ and $0 \leq x+y+z \leq 1$, alloy layers. In an illustrative embodiment, the aluminum molar fraction, x, is at least 0.8.

Growth conditions for an AlN-based nucleation layer 14 can be configured to induce three dimensional growth. For example, a growth temperature for the nucleation layer 14 can be in a range between approximately 600° C. and 1300° C. and a V/III ratio can be in a range between approximately 100 and approximately 50000. Use of a higher V/III ratio enhances vertical growth rate and restrains lateral growth. To this extent, the V/III ratio and/or time period for the growth can be adjusted to provide a target characteristic size of the islands in the nucleation layer 14. Additionally, formation of the nucleation layer 14 can use dissimilar materials including, for example, indium nitride (InN), gallium nitride (GaN), aluminum nitride (AlN), silicon nitride (SiN), any of their alloys, and/or the like.

Growth conditions for an AlN-based cavity containing layer 16 can be configured to induce island growth and the presence of cavities within the cavity containing layer 16. For example, a growth temperature for the cavity containing layer 16 can be in a range between approximately 800° C. and 1500° C. and a V/III ratio can be more than approximately 100, e.g., in a range between approximately 100 and approximately 10000. The V/III ratio can be adjusted based on a target lateral growth rate, which can adjust a vertical dimension of the cavities. Additionally, additional auxiliary agents (e.g., precursors), such as zinc oxide (ZnO), titanium nitride (TiN), SiN, gallium arsenide (GaAs), aluminum arsenide (AlAs), GaN, InN, and/or the like, can be used to induce cavities within the cavity containing layer 16, thereby altering the elastic properties of the cavity containing layer 16.

Growth conditions for an AlN-based semiconductor layer 18 can be configured to induce coalescence of nucleated islands in the cavity containing layer 16 into a single layer. For example, a growth temperature for the semiconductor layer 18 can be in a range between approximately 1100° C. and 1600° C. and a V/III ratio can be in a range between approximately 1 and approximately 2500. Subsequent growth can result in a fully coalesced, pit-free single-crystalline AlN semiconductor layer. The semiconductor layer 18 can be grown to any desired thickness, e.g., within a range of thicknesses between 1 nanometer and 10000 nanometers. An addition of a small molar fraction of gallium (e.g., one to five percent) within the semiconductor layer 18 can increase the coalescence of the nucleated islands. In an embodiment, a molar fraction of aluminum in the semiconductor layer 18 differs from the molar fraction of aluminum in the cavity containing layer 16 by at least two percent. The pressure used for growing the semiconductor layer 18 can be under 100 torr, and can be kept constant for the entire duration of the growth. The pressure can be balanced by, for example, modifying the amount of hydrogen in the chamber.

Various embodiments of the structure 10 can be achieved by varying one or more of the growth parameters, such as temperature, pressure, V/III ratio, molar concentration of group III elements, and/or the like. Additionally, one or more layers 14, 16, 18 can be grown with a flux of one or more additional precursors. Illustrative precursors include: trimethylaluminum, trimethylgallium, trimethylindium, triethylgallium, triethylboron, and/or the like. The precursor fluxes can be delivered at flow rate(s) of at least one micro-moles per minute.

Figure 3:
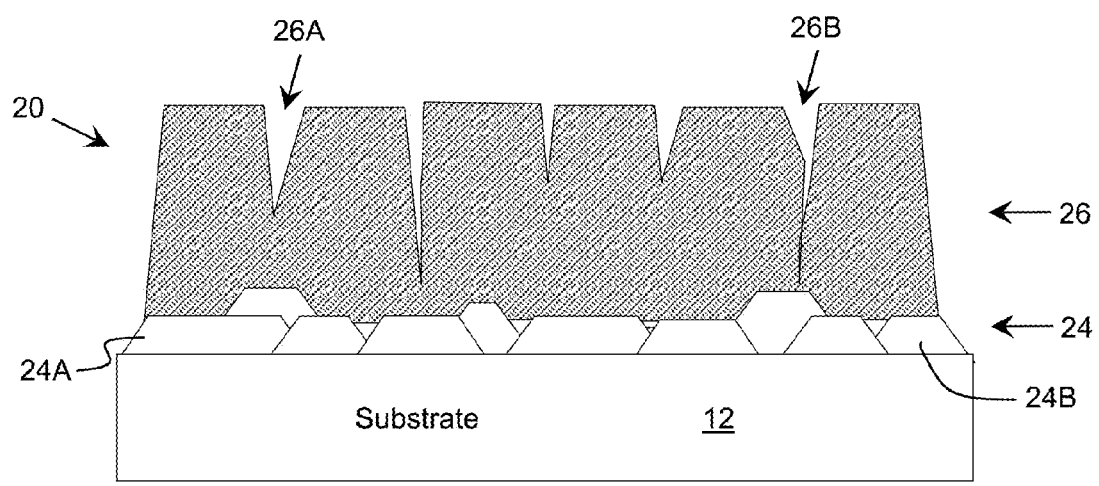
FIG. 3 shows an illustrative structure according to an embodiment.

FIG. 3 shows an illustrative structure 20 according to another embodiment. In this case, the structure 20 includes a nucleation layer 24, which can be epitaxially grown on the substrate 12, and contain no large scale cavities. In an embodiment, the nucleation layer 24 has a thickness of at least one nanometer. It is understood that the nucleation layer 24 may contain small scale cavities and inhomogeneities due to the nucleation islands 24A, 24B forming the layer 24. As used herein, small scale cavities refers to cavities having a characteristic size (e.g., as determined by a largest lateral cross-section of the cavity) of approximately one nanometer or less.

A cavity containing layer 26 can be grown on the nucleation layer 24 using growth parameters configured to cause the formation of large scale cavities 26A, 26B in the cavity containing layer 26. The cavity containing layer 26 can have any thickness, e.g., in a range between approximately 10 nanometers and 10000 nanometers. The growth conditions for formation of large structures leading to cavity containing layer 26 can be chosen to ensure three-dimensional growth, e.g., by having a high V/III ratio combined with a few hundred degrees Celsius increase in temperature as compared to the temperature used to grow the nucleation layer 24. The structures are then allowed to coalesce by changing the growth condition to promote two-dimensional growth, which can be accomplished by a reduction of the V/III ratio and a further increase in growth temperature (e.g., by several hundred degrees Celsius).

The cavities 26A, 26B can be of various sizes and have various distribution and densities throughout the cavity containing layer 26. For example, a characteristic size of the large scale cavities 26A, 26B can exceed approximately one nanometer. In a more particular illustrative embodiment, a characteristic size of the large scale cavities 26A, 26B can range between approximately 10 nanometers and approximately 4000 nanometers. Furthermore, the cavities 26A, 26B can have any of various characteristic separations. In an embodiment, a characteristic separation of the cavities 26A, 26B (e.g., as determined by a shortest distance between the edges of two adjacent cavities) can range between approximately 5 nanometers and approximately 1 micron (e.g., approximately a few hundred nanometers in an illustrative embodiment). Regardless, as described herein, the characteristic size of the cavities 26A, 26B present in the cavity containing layer 26 is determined by the growth parameters, such as growth temperature, pressure, V/III ratio, and/or the like, used during epitaxial growth of the cavity containing layer 26.

In an embodiment, the growth parameters differ between adjacent layers in the semiconductor structure 20. For example, each semiconductor layer in a semiconductor structure can be grown at a temperature at least five percent different from the temperature used during growth of the adjacent layer(s). Similarly, each semiconductor layer in a semiconductor structure can be grown at a V/III ratio at least five percent different from the temperature used during growth of the adjacent layer(s). One or more portions of the epitaxial growth described herein can be reapplied and/or applied repeatedly to produce various structures with semiconductor layers and/or superlattices for modifying elastic/plastic characteristics of the semiconductor layers and for releasing internal buildup stresses.

Figure 4:
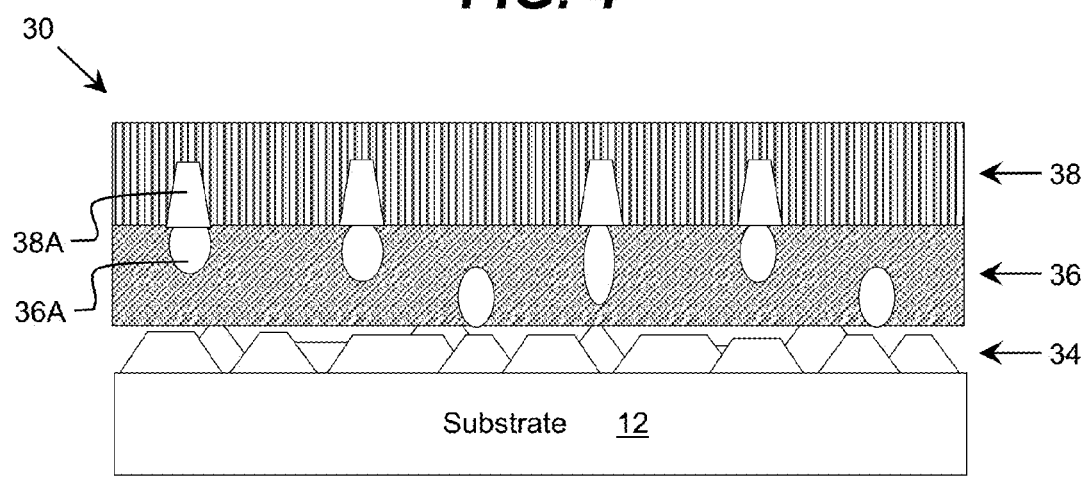
FIG. 4 shows an illustrative structure according to an embodiment.

For example, FIG. 4 shows an illustrative structure 30 according to still another embodiment. In this case, the structure 30 includes a nucleation layer 34 grown directly on a substrate 12 and a cavity containing layer 36 grown directly on the nucleation layer 34. As described herein, growth conditions used during growth of the cavity containing layer 36 can be configured to cause a plurality of cavities 36A to be present in the layer 36. As shown in FIG. 2, a layer grown on the cavity containing layer 36 (e.g., the semiconductor layer 18) can be grown using growth conditions in which no large scale cavities will be present. Alternatively, as shown in FIG. 4, a second cavity containing layer 38 is grown directly on the cavity containing layer 36 using growth conditions configured to induce cavities 36A present in the cavity containing layer 36 (e.g., those present at the top of the cavity containing layer 36) to extend into the second cavity containing layer 38. As a result, the second cavity containing layer 38 also includes a plurality of cavities 38A, which are substantially aligned with cavities 36A present in the cavity containing layer 36. Such cavities 38A can vary in shape and/or size from the cavities 36A present in the cavity containing layer 36, e.g., due to use of one or more different growth conditions for the second cavity containing layer 38.

Figure 5:
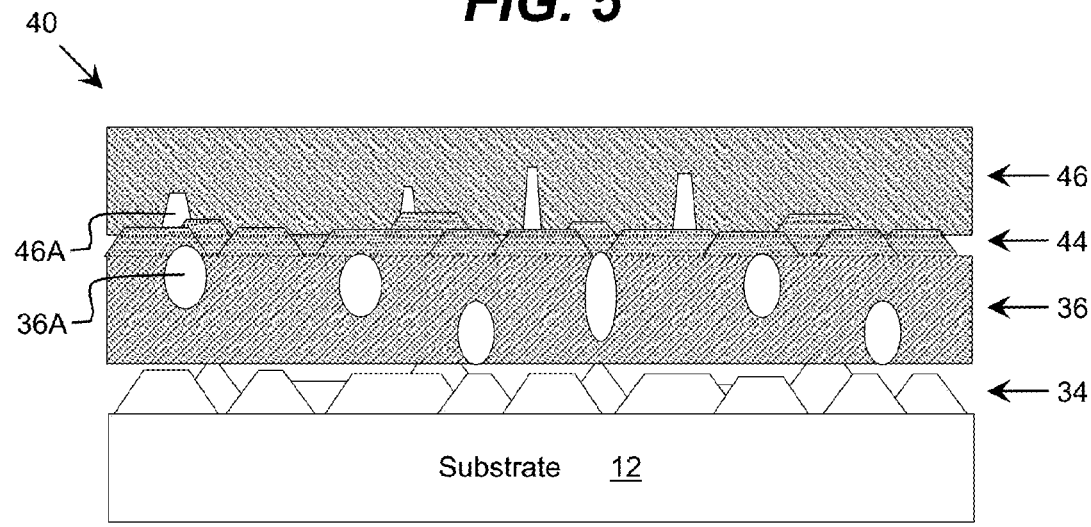
FIG. 5 shows an illustrative structure according to an embodiment.

FIG. 5 shows still another illustrative structure 40 according to an embodiment. In this case, similar to the structure 30 shown in FIG. 4, a nucleation layer 34 is located directly on a substrate 12, and a cavity containing layer 36 is located directly on the nucleation layer 34. However, the structure 40 also includes a second nucleation layer 44, which is grown on the cavity containing layer 36, and a second cavity containing layer 46, which is grown on the second nucleation layer 44. To this extent, the structure 40 includes multiple nucleation layers 34, 44 and multiple cavity containing layers 36, 46. While the structure 40 is shown including two nucleation layers 34, 44 and two cavity containing layers 36, 46, it is understood that a structure 40 can include any number of nucleation and/or cavity containing layers.

As illustrated, the cavities 36A, 46A present in the respective cavity containing layers 36, 46 can have different sizes, different densities, and/or the like, depending on the growth conditions used for the layers 36, 46. Furthermore, the cavities 36A, 46A present in the respective cavity containing layers 36, 46 may not have any particular alignment and can be misaligned. In an embodiment, a structure 40 includes a cavity containing layer, such as the cavity containing layer 46, with cavities 46A having one or more characteristic dimensions (e.g., lateral size, vertical size, density, separation, and/or the like) that differs by at least five percent from the corresponding characteristic dimension(s) of the cavities 36A present in the previous cavity containing layer 36.

Since the presence of cavities 36A, 46A affects the elastic properties of the corresponding semiconductor layers 36, 46, a multilayered semiconductor structure 40 containing multiple semiconductor layers 36, 46 with variable cavity sizes and densities can allow for control of elastic properties of the semiconductor layers throughout the vertical dimension of the semiconductor structure 40. Additional control of elastic properties of a semiconductor structure can be provided by a superlattice of semiconductor layers, in which semiconductor layers with cavities are interchanged with semiconductor layers having no large scale cavities.

Figure 6A:
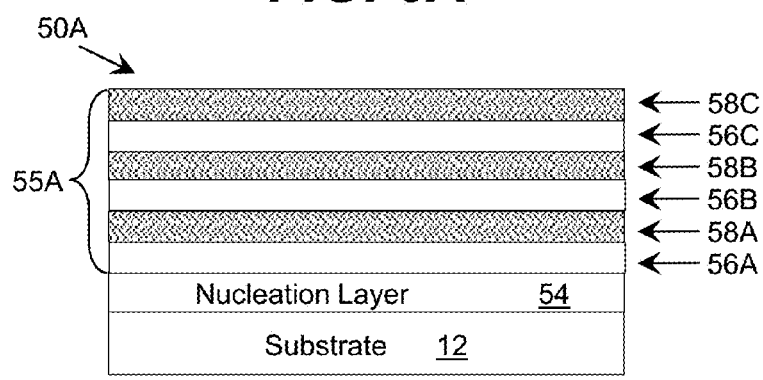
FIGS. 6A-6C show illustrative structures including superlattices according to embodiments.
Figure 6B:
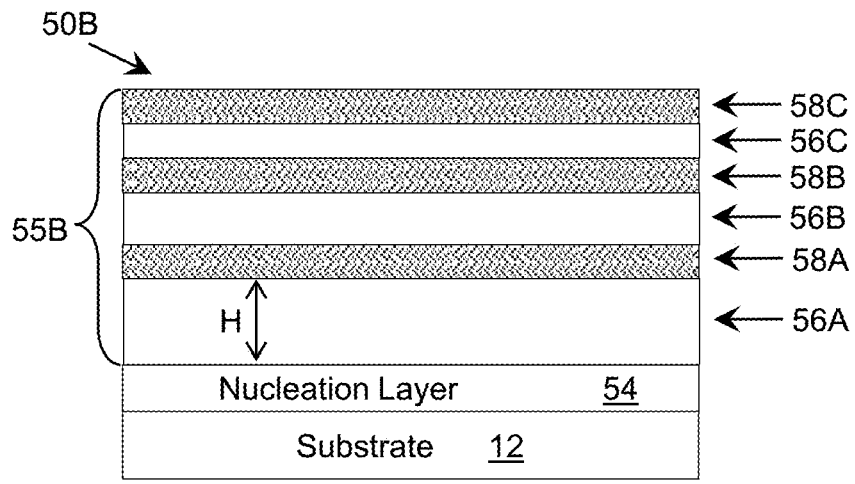
Figure 6C:
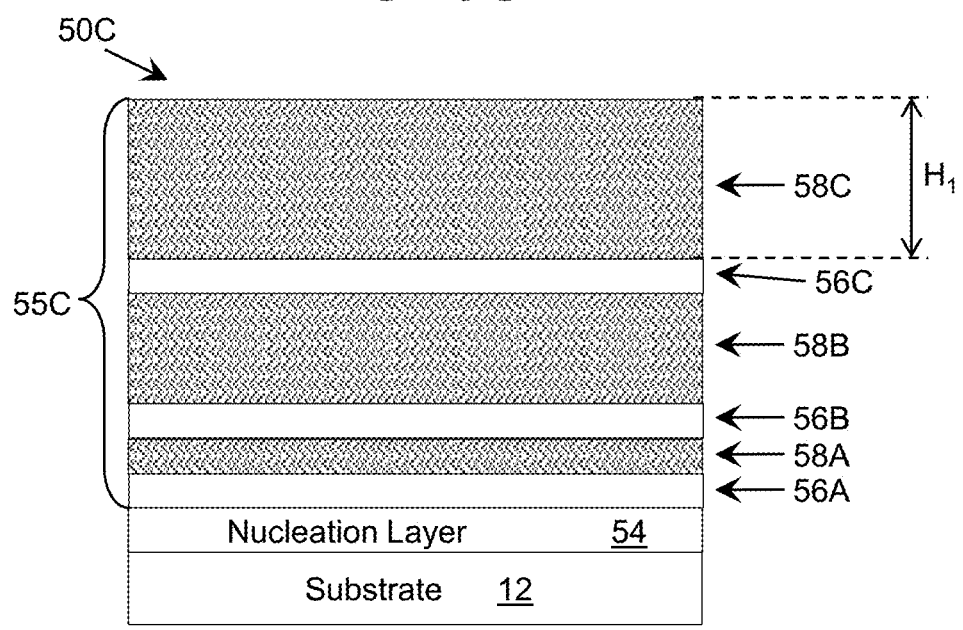

To this extent, FIGS. 6A-6C show illustrative structures 50A-50C including superlattices 55A-55C, respectively, according to embodiments. Each structure 50A-50C is shown including a substrate 12 and a nucleation layer 54 located thereon, each of which can be configured as described herein. Each superlattice 55A-55C can be grown on the nucleation layer 54. Each superlattice 55A-55C includes cavity containing layers 56A-56C interchanged with semiconducting layers 58A-58C having no large scale cavities. While the structures 50A-50C are shown as including superlattices 55A-55C, each with six layers, it is understood that a superlattice described herein can include any number of layers. Additionally, it is understood that an embodiment can provide structures with similar layer configurations as shown in FIGS. 6A-6C, which are not part of a superlattice.

Regardless, a superlattice 55A-55C can have any of various possible configurations. For example, as illustrated in FIG. 6A, each of the layers 56A-56C, 58A-58C in the superlattice 55A can have substantially similar vertical thicknesses. In an embodiment, the superlattice includes multiple pairs of layers, where each pair includes a cavity containing layer, such as layer 56A, and an adjacent semiconducting layer 58A. One or more attributes of one or both layers in a pair can vary from one side of the superlattice to the other side of the superlattice. For example, in FIG. 6B, the superlattice 55B includes cavity containing layers 56A-56C having variable thicknesses H throughout the superlattice 55B. In an embodiment, the thickness H of each cavity containing layer 56A-56C decreases with distance from the nucleation layer 54. Similarly, as shown in FIG. 6C, the superlattice 55C includes semiconducting layers 58A-58C having variable thicknesses $H_1$ throughout the superlattice 55C. In an embodiment, the thickness $H_1$ of each semiconducting layer 58A-58C increases with distance from the nucleation layer 54. In a more particular illustrative embodiment, the thicknesses H and/or $H_1$ of layers in adjacent pairs of layers differ by at least five percent.

Figure 7A:
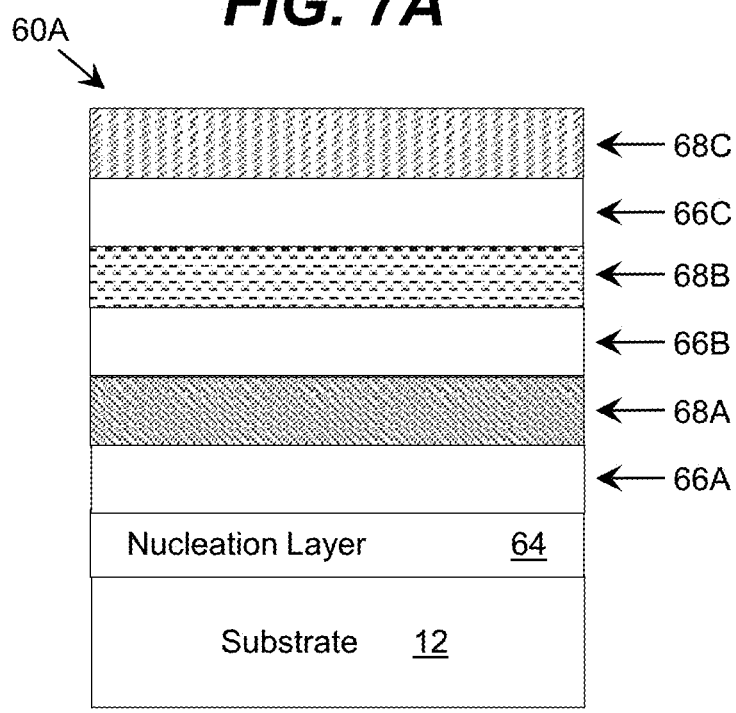
FIGS. 7A and 7B show illustrative structures according to embodiments.
Figure 7B:
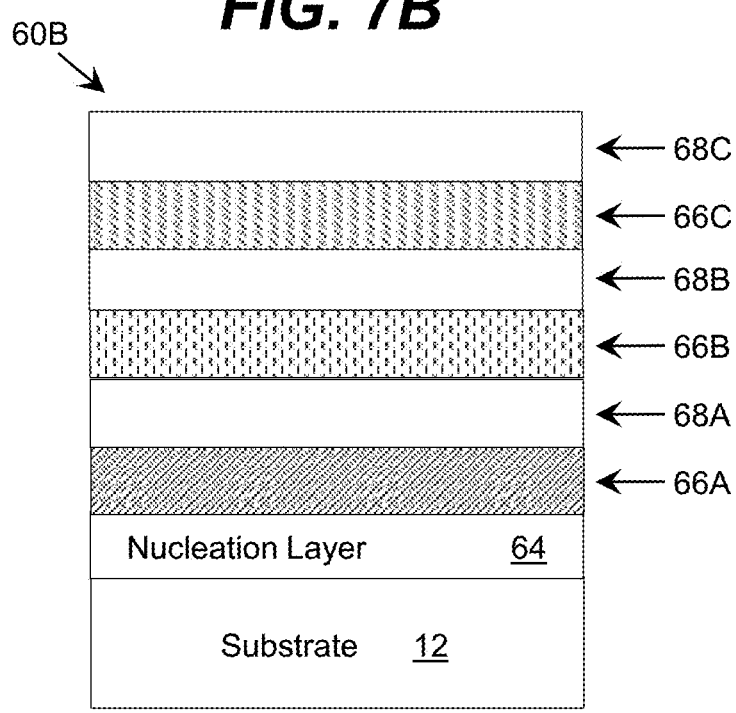

The various layers described herein can be formed of a substantially uniform composition. Alternatively, a composition of one or more layers can be altered during formation of the layer. For example, FIGS. 7A and 7B show illustrative structures 60A, 60B according to embodiments. Each structure 60A, 60B is shown including a substrate 12 and a nucleation layer 64 located thereon, each of which can be configured as described herein. A series of layers can be grown on the nucleation layer 64, and include cavity containing layers 66A-66C interchanged with semiconducting layers 68A-68C having no large scale cavities. In an embodiment, the series of layers 66A-66C, 68A-68C forms a superlattice.

In FIG. 7A, the semiconducting layers 68A-68C in the structure 60A have compositions that differ from each other by at least one percent. In an embodiment, the compositions of the layers 68A-68C can result in band gaps for the layers 68A-68C that differ from each other by at least two percent. The composition of a group III nitride layer 68A-68C can be determined based on a molar fraction of aluminum in the layer 68A-68C. In an embodiment, the composition of the layers 68A-68C can be chosen to be roughly an average between 1 and a molar fraction of an n-type contact layer in the structure. For example, if the n-type contact layer contains a molar fraction of aluminum, x=0.6, then the average composition of the superlattice layers 68A-68C can be about x=0.8, with the composition of individual superlattice layers chosen to maintain such an average composition. For instance, the superlattice layers can comprise $Al_{0.65}Ga_{0.35}N$ layers interchanged with AlN of an appropriate thickness to yield an average composition of 0.8 within such superlattice.

Furthermore, one or more of the layers 68A-68C can have a graded composition in which a molar fraction of one or more elements in the layer 68A-68C varies throughout the layer 68A-68C. For example, for a group III nitride layer 68A-68C, an aluminum molar fraction can vary between different layers 68A-68C and/or within a layer 68A-68C. To this extent, formation of a group III nitride layer 68A-68C can include a series of growth steps, with each growth step having at least one of: a change in V/III ratio or a change in growth temperature. In an embodiment, such change(s) differ from the V/III ratio and/or growth temperature used in a previous growth step by at least one percent. Alternatively, growth of a group III nitride layer 68A-68C can use a continuously changing (e.g., monotonic, pulsed, or periodic) V/III ratio and/or growth temperature. In an embodiment, a molar fraction of an element, such as an aluminum molar fraction in a graded group III nitride layer, differs by at least one percent from one side of the layer to the opposing side of the layer. The grading can vary, for example, from a high aluminum content closer to an AlN layer on a side of the structure 60A to a low aluminum content on a side of the structure 60A closer to an n-type contact layer. Similarly, in FIG. 7B, the cavity containing layers 66A-66C in the structure 60B can have compositions that differ from each other by at least one percent and/or have graded compositions. Furthermore, the cavities within each of the cavity containing layers 66A-66C can have a characteristic density (e.g., separation) and/or a characteristic size that differs from those of the cavities in the other cavity containing layers 66A-66C by at least one percent.

While illustrative scenarios of varying attributes (e.g., thicknesses, compositions, cavities, etc.) are separately shown and described in FIGS. 6A-6C and 7A-7B. It is understood that a structure can include any combination of varying attributes. Furthermore, the attributes can be varied in an alternative manner to those shown in FIGS. 6A-6C and 7A-7B. For example, thicknesses can vary in an alternative direction, vary in a non-sequential manner, and/or the like. Regardless, the attributes of the various layers can be configured to achieve a target distribution of elastic properties of the semiconductor layers in a structure, and as a result, a target distribution of stresses throughout the structure.

The inclusion of one or more cavity containing layers in a semiconductor structure can be combined with other known techniques for manipulating stresses within semiconductor layers. For example, a structure described herein can include semiconductor layers having alternating tensile and compressive stresses combined with cavity containing layers. Tensile and compressive stresses can be varied, for example, by adjusting a V/III ratio used in growing the layers.

Figure 8:
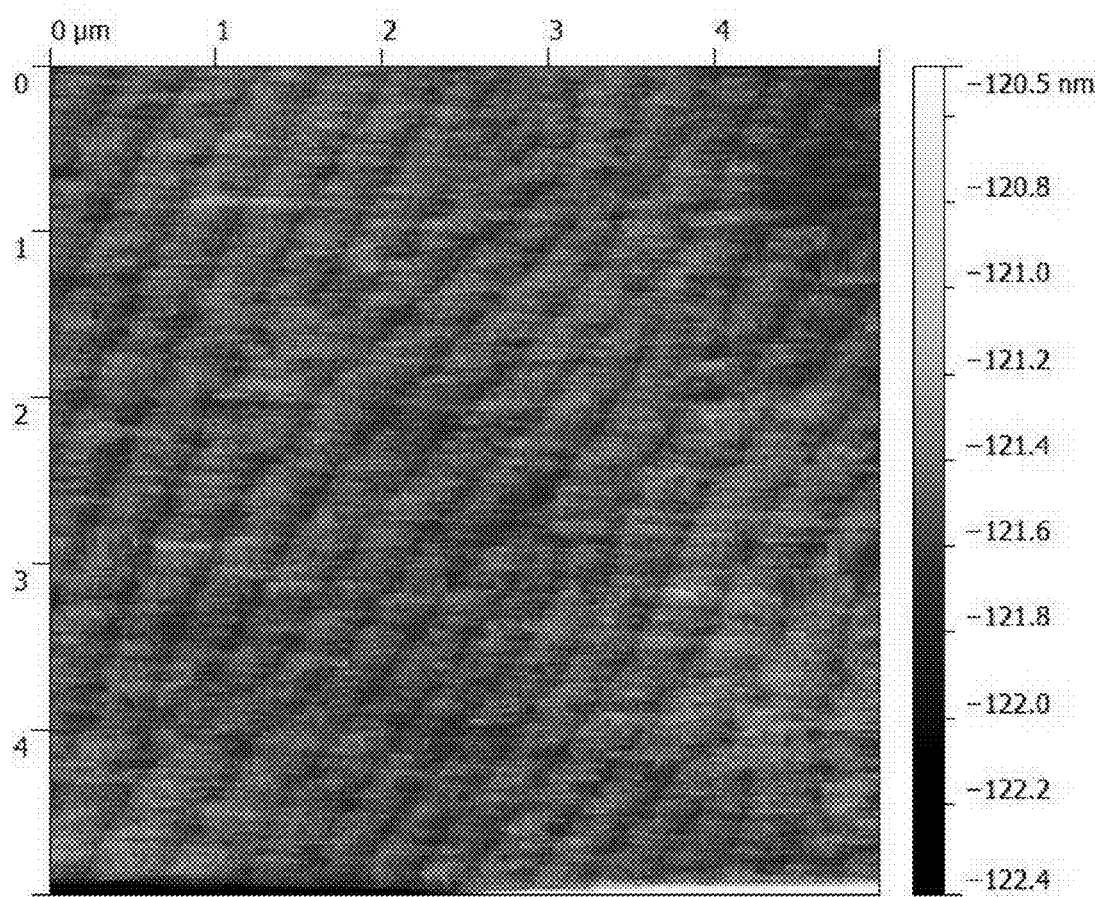
FIG. 8 shows an image surface morphology of an illustrative cavity containing layer according to an embodiment.

The inventors have formed and analyzed structures described herein. FIG. 8 shows an image illustrating surface morphology of an illustrative cavity containing layer according to an embodiment. The cavity containing layer was epitaxially grown using a method described herein. The image was captured using an atomic force microscope (AFM) and shows a five micron by five micron area of the surface. As illustrated, the atomic step shows an extremely flat surface with an RMS of approximately 1.0 Angstroms.

A structure described herein can be implemented as part of any of various types of optoelectronic or electronic devices. An embodiment provides a device formed using group III nitride semiconductor layers. In such a case, controlling stress characteristics can be important for reducing cracks and dislocations. In a more particular embodiment, the device is a light emitting device, such as a diode, in which the control of stress and dislocations within and in proximity of the active layer can provide improved device operation and extended lifetime of the device. Illustrative devices include: a laser diode, a light emitting diode, a photodiode, a deep ultraviolet light emitting diode, a high mobility electron transistor, a field effect transistor, a p-n diode, a Schottky diode, and/or the like.

In an embodiment, a structure described herein, such as the structure 10 (FIG. 2) or the structure 20 (FIG. 3), is used as a template for subsequent formation of any of various types of devices. In this case, the template can be formed and subsequently provided for growth of one or more layers of any combination of various types of semiconductor devices on the template. To this extent, the formation of the semiconductor device can include: epitaxial growth of a n-type contact layer on the semiconductor structure (e.g., template); epitaxial growth of an active layer (e.g., including quantum wells and barriers) on the n-type contact layer; and epitaxial growth of a p-type contact layer on the active layer. In another embodiment, the substrate can be removed, e.g., by laser, along the cavity regions to create a structure of free-standing semiconductor layers.

Figure 9:
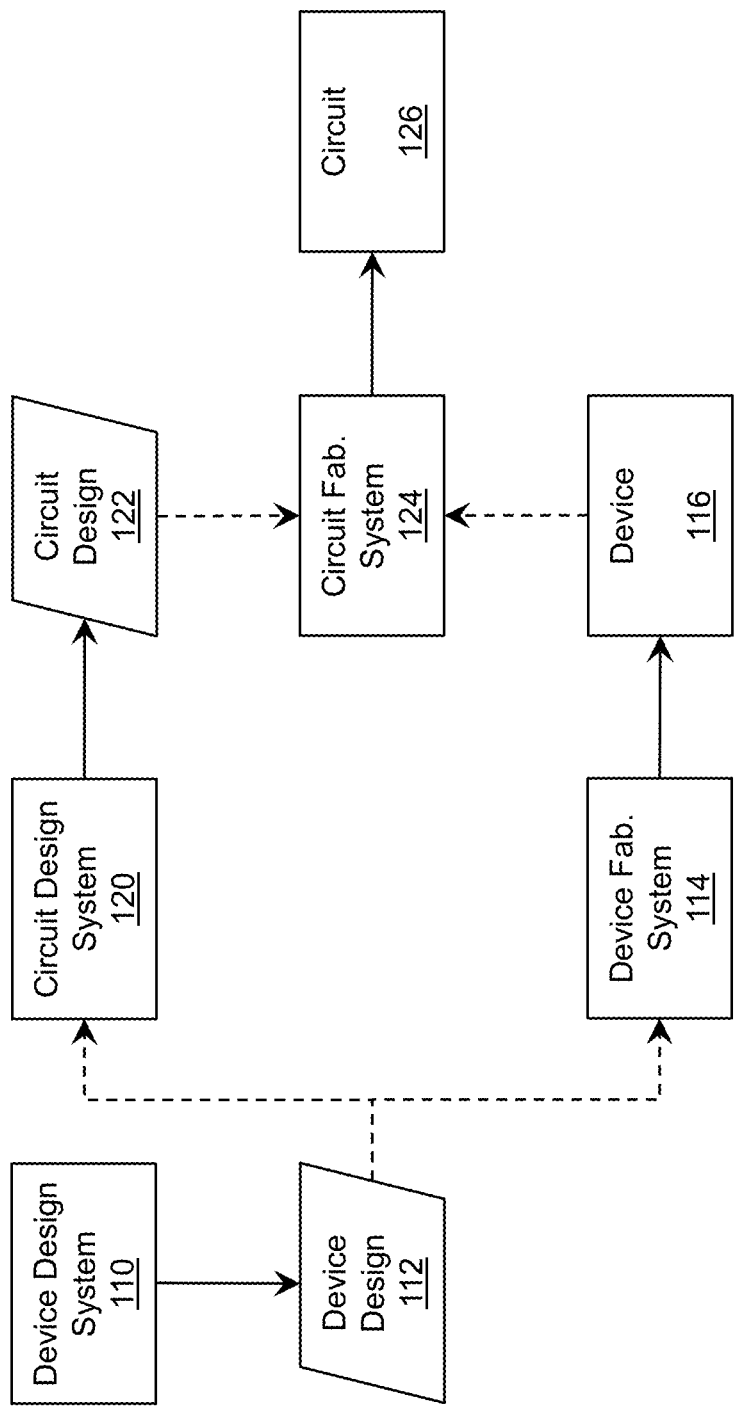
FIG. 9 shows an illustrative flow diagram for fabricating a circuit according to an embodiment.

In one embodiment, the invention provides a method of designing and/or fabricating a circuit that includes one or more of the devices designed and fabricated as described herein (e.g., including one or more devices fabricated using a semiconductor structure described herein). To this extent, FIG. 9 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
an active region;
a p-type contact layer located on a first side of the active region; and
a n-type contact layer located on a second side of the active region opposite the first side, wherein the n-type contact layer is located between the active region and a semiconductor structure comprising:
a cavity containing layer, wherein the cavity containing layer is formed of a semiconductor material, has a thickness greater than two monolayers, and has a plurality of cavities, and wherein the plurality of cavities have a characteristic size of at least one nanometer and a characteristic separation of at least five nanometers.

2. The device of claim 1, wherein the semiconductor structure further comprises:
a substrate;
a nucleation layer located on the substrate, wherein the nucleation layer has a thickness of at least one nanometer and contains no large scale cavities, and wherein the cavity containing layer is located directly on the nucleation layer; and
a semiconductor layer located directly on the cavity containing layer.

3. The device of claim 2, wherein the semiconductor layer is an AlN layer having a thickness between approximately 1 micron and approximately 4 microns.

4. The device of claim 2, wherein the semiconductor layer contains no large scale cavities.

5. The device of claim 2, wherein the cavity containing layer and the semiconductor layer are part of a superlattice of semiconductor layers including a plurality of cavity containing layers interchanged with a plurality of semiconductor layers.

6. The device of claim 5, wherein a bandgap for each semiconductor layer in the plurality of semiconductor layers differs from an adjacent semiconductor layer by at least two percent.

7. The device of claim 5, wherein the plurality of semiconductor layers in the superlattice of semiconductor layers have alternating tensile and compressive stresses.

8. The device of claim 1, wherein the device is configured to operate as one of: a laser diode, a light emitting diode, a photodiode, a deep ultraviolet light emitting diode, a high mobility electron transistor, a field effect transistor, a p-n diode, or a Schottky diode.

9. The device of claim 1, wherein the cavity containing layer has a thickness between approximately one micron and approximately ten microns.

10. A device comprising:
an active region;
a p-type contact layer located on a first side of the active region; and
a n-type contact layer located on a second side of the active region opposite the first side, wherein the n-type contact layer is located between the active region and a semiconductor structure comprising:
a superlattice of semiconductor layers comprising:
a plurality of cavity containing layers alternating with a plurality of semiconductor layers, wherein each cavity containing layer is formed of a semiconductor material, has a thickness greater than two monolayers, and has a plurality of cavities, and wherein the plurality of cavities have a characteristic size of at least one nanometer and a characteristic separation of at least five nanometers, and wherein each semiconductor layer contains no cavities.

11. The device of claim 10, wherein at least one of: the plurality of cavity containing layers or the plurality of semiconductor layers, have compositions that differ by at least one percent.

12. The device of claim 11, wherein an average molar fraction of aluminum in the at least one of: the plurality of cavity containing layers or the plurality of semiconductor layers, is between 1 and a molar fraction of the n-type contact layer.

13. The device of claim 10, wherein at least one layer in at least one of: the plurality of cavity containing layers or the plurality of semiconductor layers has a graded composition.

14. The device of claim 13, wherein a molar fraction of an element in the at least one layer differs by at least one percent from a first side of the at least one layer to an opposing side of the at least one layer.

15. The device of claim 10, wherein at least one of: the characteristic size or the characteristic separation, of the plurality of cavities in a first cavity containing layer differs from the characteristic size or the characteristic separation of the plurality of cavities in a second cavity containing layer by at least one percent.

16. The device of claim 10, wherein the plurality of semiconductor layers in the superlattice of semiconductor layers have alternating tensile and compressive stresses.

17. The device of claim 10, wherein the device is configured to operate as one of: a laser diode, a light emitting diode, a photodiode, a deep ultraviolet light emitting diode, a high mobility electron transistor, a field effect transistor, a p-n diode, or a Schottky diode.

18. A structure comprising:
a superlattice of semiconductor layers comprising:
a plurality of cavity containing layers alternating with a plurality of semiconductor layers, wherein each cavity containing layer is formed of a semiconductor material, has a thickness greater than two monolayers, and has a plurality of cavities, and wherein the plurality of cavities have a characteristic size of at least one nanometer and a characteristic separation of at least five nanometers, and wherein each semiconductor layer contains no cavities.

19. The structure of claim 18, wherein at least one of: the plurality of cavity containing layers or the plurality of semiconductor layers have compositions that differ by at least one percent.

20. The structure of claim 18, wherein at least one layer in at least one of: the plurality of cavity containing layers or the plurality of semiconductor layers has a graded composition.

* * * * *